(12) United States Patent
Abe et al.

(10) Patent No.: US 11,503,706 B2
(45) Date of Patent: *Nov. 15, 2022

(54) ELASTIC CIRCUIT BOARD AND PATCH DEVICE IN WHICH SAME IS USED

(71) Applicant: PANASONIC INTELLECTUAL PROPERTY MANAGEMENT CO., LTD., Osaka (JP)

(72) Inventors: Takatoshi Abe, Osaka (JP); Tomoaki Sawada, Osaka (JP); Tomohiro Fukao, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 10 days.

This patent is subject to a terminal disclaimer.

(21) Appl. No.: 17/371,955

(22) Filed: Jul. 9, 2021

(65) Prior Publication Data

US 2021/0337660 A1 Oct. 28, 2021

Related U.S. Application Data

(63) Continuation of application No. 16/643,764, filed as application No. PCT/JP2018/032672 on Sep. 3, 2018, now Pat. No. 11,096,276.

(60) Provisional application No. 62/553,967, filed on Sep. 4, 2017.

(51) Int. Cl.
*H05K 1/02* (2006.01)
*H05K 1/03* (2006.01)

(52) U.S. Cl.
CPC ......... *H05K 1/0283* (2013.01); *H05K 1/0393* (2013.01); *H05K 2201/0133* (2013.01)

(58) Field of Classification Search
CPC ............... H05K 1/0283; H05K 1/0393; H05K 2201/0133
USPC .......................................................... 174/254
See application file for complete search history.

(56) References Cited

U.S. PATENT DOCUMENTS

| | | | |
|---|---|---|---|
| 2013/0182997 A1* | 7/2013 | Fujiwara | G02B 6/4214 277/316 |
| 2014/0071639 A1* | 3/2014 | Honjo | H05K 3/4069 174/254 |
| 2016/0362546 A1* | 12/2016 | Hasegawa | H01L 23/49894 |
| 2017/0034907 A1 | 2/2017 | Iwase | |
| 2017/0245362 A1 | 8/2017 | Iwase | |

(Continued)

FOREIGN PATENT DOCUMENTS

| | | |
|---|---|---|
| JP | 2014-162124 | 9/2014 |
| JP | 2016-143763 | 8/2016 |

(Continued)

OTHER PUBLICATIONS

Official Communication issued in International Bureau of WIPO Patent Application No. PCT/JP2018/032672, dated Nov. 20, 2018.

*Primary Examiner* — Sherman Ng

(74) *Attorney, Agent, or Firm* — Greenblum & Bernstein, P.L.C.

(57) ABSTRACT

A stretchable circuit board includes a stretchable base material, a stretchable wiring, and a land part that is in contact with the stretchable base material. The land part is formed of a patterned metal foil, or a printed product of an electroconductive ink containing metal particles. The stretchable base material has a tensile modulus at 25° C. room temperature of 0.5 MPa to 0.5 GPa.

14 Claims, 7 Drawing Sheets

(56) References Cited

U.S. PATENT DOCUMENTS

2018/0027661 A1   1/2018  Ogura
2018/0092206 A1*  3/2018  Iwase ................... H05K 1/0283

FOREIGN PATENT DOCUMENTS

| JP | 2017-034038 | 2/2017 |
| JP | 2017-37988 | 2/2017 |
| JP | 2017-112312 | 6/2017 |
| JP | 2017-152687 | 8/2017 |
| WO | 2015/052853 | 4/2015 |
| WO | 2016/108888 | 7/2016 |

* cited by examiner

ELASTIC CIRCUIT BOARD AND PATCH DEVICE IN WHICH SAME IS USED

CROSS REFERENCE PARAGRAPH

This application is a Continuation of U.S. patent application Ser. No. 16/643,764, filed Mar. 2, 2020, which is a National Stage Entry of International Patent Application No. PCT/JP2018/032672, filed Sep. 3, 2018, which claims priority from Provisional Application No. 62/553,967, filed Sep. 4, 2017. The disclosure of each of these documents, including the specification, drawings, and claims, is incorporated herein by reference in its entirety.

TECHNICAL FIELD

The present invention relates to a stretchable circuit board, and a patch device using the stretchable circuit board.

BACKGROUND ART

In various applications in the technical field of electronics, particularly sensors, displays, artificial skins for robots, and the like, demands for attachability and shape followability have increased, and a so-called patch device, which is flexible and thus can be disposed on a curved surface, an uneven surface and the like and can be freely deformed, is demanded. For such demand, electronic devices having stretchability are studied and are abundantly expected as stretchable electronics technologies that are responsible for the next generation.

However, in order to freely deform an electronic device, not only stretchability is necessary for an electron circuit board, but also resistance against a modification stress applied to an electronic part mounted on the electron circuit board is also necessary. Therefore, means for alleviating stress concentration applied to an electronic circuit to prevent a wiring part from breaking during extension and contraction have been considered in the past.

For example, Patent Literature 1 reported an electronic part including: a stretchable substrate; and an element and/or a wiring formed on the stretchable substrate, wherein the stretchable substrate includes a base material formed of a stretchable material, and an island formed of a material having a higher Young's modulus than that of the base material, and the island is embedded on the base material in a state where the island is exposed on one of the main surfaces of the base material.

Furthermore, Patent Literature 2 reported a stretchable wiring substrate including: a stretchable sheet-like stretchable base material; a stretchable wiring part formed on at least one of main surfaces of the stretchable base material; and an outer terminal connected to the wiring part, which has a reinforced region and a stretchable region with a predetermined structure to allow alleviation of partial stress concentration and prevention of the breakage of the wiring part.

On the other hand, it is known that joining by soldering is very effective for connecting an electronic part and a base material. However, use of soldering requires heat resistance that can stand a high temperature area necessary for mounting.

Furthermore, in order to prevent failures such as dropping off of an electronic part from a base material to which the electronic part is connected, the adhesiveness between the electronic part and the base material via soldering is also important.

Therefore, various resin materials are used in the stretchable circuit boards as mentioned above so as to alleviate stress concentration on electronic parts. However, by only considering resin materials, it is sometimes difficult to improve, for example, adhesiveness, and durability such as heat resistance and chemical resistance together with the above-mentioned alleviation of stress concentration. Therefore, in conventional stretchable wiring substrates, materials that do not have sufficient heat resistance and the like necessary for soldering connection should be used in some cases.

Furthermore, there is a concern that designing of entirety of a circuit board is abundantly complicated due to restriction of materials, which consequently leads to an increase in production costs.

CITATION LIST

Patent Literatures

Patent Literature 1: JP 2017-34038 A
Patent Literature 2: JP 2014-162124 A

SUMMARY OF INVENTION

The present invention has been made in view of the above-mentioned problem, and aims at providing a stretchable circuit board on which electronic parts that can be produced by using existing facilities can be mounted by an existing solder, and which is excellent in adhesiveness, heat resistance and the like.

Specifically, the stretchable circuit board according to one aspect of the present invention includes a stretchable base material, a stretchable wiring, and a land part that is in contact with the stretchable base material.

DESCRIPTION OF EMBODIMENTS

Until now, there have been little reports that soldering mounting was used as means for enhancing the general versatility of the processability in a mounting method in a stretchable circuit board. The reason therefor is considered that it has been tried to alleviate stress concentration during extension and contraction which occurs in a stretchable base material in a stretchable circuit board by a combination of materials for use in the circuit. Therefore, various mounting methods other than soldering mounting such as means using an electroconductive pressure-sensitive adhesive or an adhesive, and the like have been suggested for mounting a part on a circuit board.

Therefore, the present inventors conducted intensive studies, and consequently found that a stretchable substrate that has excellent stretchability and producibility and allows mounting of an electronic part on the substrate by an existing solder by using a land for connecting an electronic part via soldering, a stretchable base material, and a stretchable wiring. The present inventors considered that, if soldering mounting becomes possible, the stretchable substrate has mountability with excellent connection reliability, and also has excellent repairability and self-alignment property, and thus high producibility and excellent connection reliability can be obtained, and that the investment costs can be minimized since existing facilities can be utilized. Based on such findings, the present inventors conducted further intensive studies and completed the present invention.

That is, the stretchable circuit board according to one aspect of the present invention includes a stretchable base material, a stretchable wiring, and a land part that is in contact with the stretchable base material.

It is considered that, according to such a configuration, it is possible to provide a stretchable circuit board including the above-mentioned land part for connecting an electronic part or the like via soldering, which is a flexible and pliable stretchable circuit board achieving a balance between excellent mountability and excellent extendability by utilizing the adhesiveness between a stretchable base material and the land part. Furthermore, an electronic device (patch device) or the like that can respond to following an optional curved surface or significant deformation can be provided by using the above-mentioned circuit board.

Furthermore, since the stretchable circuit board has a feature that it achieves a balance between high stretchability and mountability or adhesiveness, existing facilities can be applied to various technical fields such as the fields of optics, electronics, adhesives and medicine. Therefore, the stretchable circuit board is very advantageous in industrial utilization.

Hereinafter the embodiments according to the present invention will be specifically described with reference to the drawings and the like. However, the present invention is not limited to these embodiments.

Figure 1:
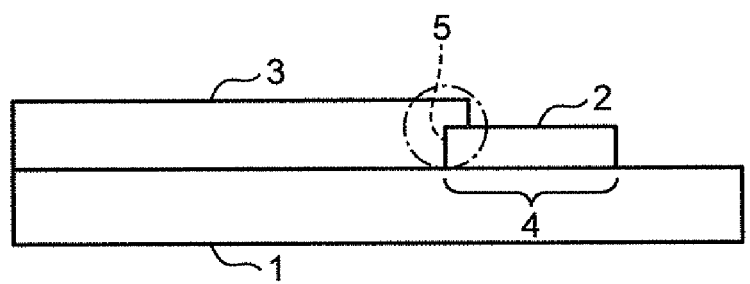
FIG. 1 is a schematic cross-sectional view illustrating a stretchable circuit board according to an embodiment of the present application.

The stretchable circuit board according to this embodiment (hereinafter also simply referred to as "circuit board" in this specification) is a stretchable circuit board mainly used for electronic components, and includes, as shown in FIG. 1, a stretchable base material 1, a stretchable wiring 3, and a land part 2 that is in contact with the stretchable base material 1.

The stretchable circuit board according to this embodiment is a circuit board that is excellent in stretchability and also excellent in mountability and adhesiveness. It is considered that, by forming a land part that is directly in contact with at least a part of a base material and a stretchable wiring on the stretchable base material in such a way, a circuit board having a property that it has stretchability and is excellent in mountability and adhesiveness, is flexible and pliable, and has durability can be provided.

In this embodiment, being excellent in mountability means that an electronic part and a circuit board can be joined by an existing solder or the like by using a reflow furnace and a soldering iron.

The stretchable base material and stretchable wiring in this embodiment have stretchability. Here, "having stretchability" means that the stretchable base material and stretchable wiring can be elastically deformed, and more specifically means that the stretchable base material and stretchable wiring have a stretchability of about 10% or more and a tensile modulus at 25° C. room temperature of 0.5 MPa to 0.5 GPa.

The circuit board of this embodiment is a structural body having a stretchability of 10% or more, preferably 25% or more, more preferably 50%, further preferably 100% or more, and having a tensile modulus at 25° C. room temperature of 0.5 MPa to 0.5 GPa, preferably 1 MPa to 300 MPa, more preferably 2 MPa to 200 MPa, further preferably 5 MPa to 100 MPa. If a circuit board has stretchability and a tensile modulus at room temperature within the above-mentioned ranges, the circuit board has high followability during deformation into an optional shape. Therefore, it is considered that a circuit board that has excellent followability on clothes and the like, and is difficult to be broken and excellent in stretchability can be obtained.

On the other hand, although it is not necessary to particularly set an upper limit for the stretchability of the circuit board, it is preferable that the stretchability is not higher than 500% from the viewpoint that plastic deformation occurs in a thermoplastic resin when the circuit board is extended more than necessary, and the original shape is lost.

Examples of the stretchable base material that can be used in this embodiment (hereinafter also simply referred to as "base material" in this specification) include stretchable resin base materials, and the stretchable resin base materials have a stretchability of 10% or more, preferably 25% or more, more preferably 50%, further preferably 100% or more, and have a tensile modulus at 25° C. room temperature of 0.5 MPa to 0.5 GPa, preferably 1 MPa to 300 MPa, more preferably 2 MPa to 100 MPa, further preferably 2 MPa to 30 MPa. On the other hand, although it is not necessary to particularly set an upper limit for the stretchability of the base material, it is preferable that the stretchability is not higher than 500% from the viewpoint that the original shape is lost when the circuit board is extended more than necessary.

The stretchable base material of this embodiment is formed of a curable resin composition or a thermoplastic resin composition. It is preferable that the curable resin composition has a thermal decomposition temperature (Td5) of 140° C. or more. The curable resin composition, a thermosetting resin composition is preferable, and any thermosetting resin composition may be used as long as it has sufficient heat resistance against the temperature in the case where the electronic part and the circuit board are joined by an existing solder or the like by using a reflow furnace or a soldering iron. Furthermore, it is desirable that the thermoplastic resin has a softening point or a melting point of 140° C. or more, preferably 160° C. or more, more preferably 180° C. or more. It is considered that the thermoplastic resin can reliably withstand the heating temperature in mounting by soldering.

Examples of the curable resin composition that can be used in the stretchable base material in this embodiment include silicone resins, urethane resins, epoxy resins, acrylic resins and fluorine rubbers, and examples of the thermoplastic resin include urethane resins, various rubbers, acrylic resins, olefin-based resins, ethylene-propylene-diene rubbers, isoprene rubbers, butadiene rubbers and chloroprene rubbers. When used in the stretchable base material that can be used in this embodiment, it is particularly preferable to use a curable resin composition in view of heat resistance against a soldering mounting temperature, and it is more preferable to use an epoxy resin, a urethane resin or a silicone resin, and it is further preferable to use an epoxy resin.

As an example of the resin composition that can be used in the stretchable base material that can be used in this embodiment, a resin composition including: (A) a polyrotaxane; (B) a thermosetting resin; and (C) a curing agent (for example, the resin composition recited in WO2015/052853 A and the like) may be exemplified.

It is preferable to use a thermosetting resin from the viewpoints that thermosetting resins are excellent in adhesion to the base material and heat resistance, and can impart functions such as low thermal expansion, control of modulus, thermal conductivity and light reflectivity by combining with a filler. More specifically, examples include resins such as epoxy resins, polyrotaxane resins, isocyanate resins, polyol resins, hydrogenated styrene-based elastomer resins and acrylic acid ester copolymerized resins, which are characterized by including alkylene oxide modification or bivalent organic groups having 2 to 5,000 carbon atoms. These may be used alone, or in combination of two or more kinds. Furthermore, the resin base material may contain various additives within the scope in which the effect of the present invention is not inhibited.

Since the electronic part is mounted on the land part via soldering in this embodiment, the adhesiveness (stability) of the land part on the circuit board is important. In this point, since the land part has higher adhesiveness with the base material than that with the wiring, the adhesiveness (stability) is improved by having a part where the base material and the land part are in contact. That is, the embodiment of the present invention also encompasses the above-mentioned stretchable circuit board on which an electronic part is mounted.

The land part in this embodiment is not particularly limited as long as at least a part of the land part is in contact with the stretchable base material, but it is generally preferable that the land part is formed of a material having good wettability against a solder and being a good conductor, and it is particularly preferable that the land part is formed of a metal foil such as a copper foil. Although the solder and the base material are not directly joined, the solder can be disposed on the base material via this land part.

Figure 2A:
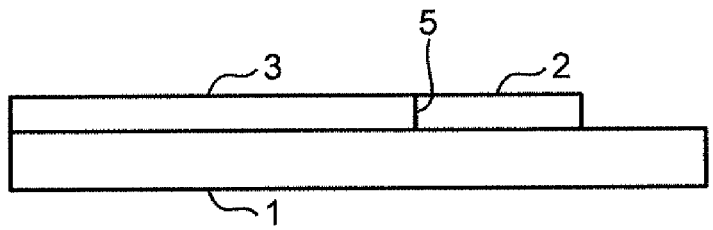
FIG. 2A, FIG. 2B, and FIG. 2C show schematic cross-sectional views illustrating some embodiments of the connecting part between the stretchable wiring and the land part in the stretchable circuit board of the present application.
Figure 2B:
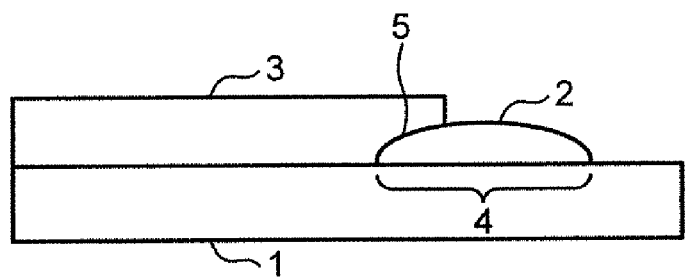

The shape of the land part, the occupancy of the land part and the like in the circuit board of this embodiment are not particularly limited as long as the circuit board satisfies the above-mentioned structure. For the purpose of mounting an electronic part, the surface area of the land part is preferably at a ratio of 10% to 1,000% with respect to the surface area of a part to be an electrode of the electronic part, and the surface area is more preferably at a ratio of 50% to 500% when the connection stability and the purpose of connection to the stretchable wiring are also taken into consideration. The shape of the land part may be, for example, the shape as shown in FIG. 1 or the shape as shown in FIG. 2(B).

The land part in this embodiment may be formed of a patterned metal foil, or a printed electroconductive ink containing metal particles. More specifically, in order to form the land part, for example, the land part may be formed by a photolithography process by using a resin-attached copper foil. The method for preparing the resin-attached copper foil is not particularly limited, and may be conducted by forming a resin layer to be the stretchable base material by varnish application or the like on the copper foil, or applying the stretchable base material and the copper foil by heat molding by heat pressure bonding or the like, or by disposing an adhesive layer between the base material surface to be the stretchable base material and the copper foil and bonding the base material surface and the copper foil together. The thickness and material of such an adhesive layer are not particularly limited, and for example, a curable resin, or a resin having high viscosity can be used. Preferably, the above-mentioned adhesive layer has a thickness of 0.1 μm to 100 μm, further preferably 0.5 μm to 50 μm, and it is preferable to use, as the material, a curable resin such as an acrylic resin, a silicone resin, a fluorine resin, an epoxy resin or a polyimide resin. Examples of the other methods for forming the land part may include a method including printing an electroconductive ink (nanoink) containing metal particles such as silver or copper, and forming a metal layer by sintering by light or heat, a method including an electroconductive ink or a paste that can be mounted by soldering, a method including forming a metal layer by depositing a metal or the like, a method for forming a metal layer by electrolysis or electroless plating, and the like can be exemplified.

Secondly, the kind of the wiring material that can be used in the stretchable wiring of this embodiment (hereinafter also simply referred to as "wiring" in the present specification) is not particularly limited within the scope in which the pliability of the stretchable base material is not lost, and the wiring material has a stretchability of 5% or more, preferably 10% or more, more preferably 25% or more, further preferably 50%, the most preferably 100% or more, and has a tensile modulus at 25° C. room temperature of 0.5 MPa to 0.5 GPa, preferably 1 MPa to 300 MPa, more preferably 1 MPa to 100 MPa, further preferably 1 MPa to 10 MPa. On the other hand, although it is not necessary to particularly set an upper limit for the stretchability of the wiring, it is preferable that the stretchability is not higher than 500% from the viewpoint that the original shape is lost when the wiring is extended more than necessary.

The stretchable wiring of this embodiment is formed of a curable resin composition or a thermoplastic resin composition. The curable resin composition, preferably a thermosetting resin composition, may be a curable resin composition having sufficient heat resistance against the temperature in the case where the electronic part and the circuit board are joined by an existing solder or the like by using a reflow furnace or a soldering iron. Furthermore, it is desirable that the thermoplastic resin has a softening point or a melting point of 140° C. or more, preferably 160° C. or more, more preferably 180° C. or more. It is considered that the thermoplastic resin can reliably withstand the heating temperature in mounting by soldering.

Including the above-mentioned curable resin composition or thermoplastic resin composition that can be used in the stretchable wiring of this embodiment, it is desirable that, in the case of the curable resin composition, the thermal decomposition temperature (Td5) is 140° C. or more, and in the case of the thermoplastic resin composition, the softening point and the melting point are both 140° C. or more, preferably 160° C. or more, more preferably 180° C. or more. It is considered that the thermoplastic resin can reliably withstand the heating temperature in mounting by soldering.

Examples of the curable resin composition that can be used in the stretchable base material in this embodiment include silicone resins, urethane resins, epoxy resins, acrylic resins and fluorine rubbers, and examples of the thermoplastic resin composition include urethane resins, various rubbers, acrylic resins, olefin-based resins, ethylene-propylene-diene rubbers, isoprene rubbers, butadiene rubbers and chloroprene rubbers. When used in the stretchable base material that can be used in this embodiment, it is particularly preferable to use a thermosetting resin composition in view of heat resistance against a soldering mounting temperature, and an epoxy resin, a urethane resin and a silicone resin are more preferable, and it is further preferable to use an epoxy resin.

Examples of the material for the wiring material that can be used in the stretchable wiring of this embodiment include an electroconductive resin composition including a binder resin and electroconductive particles, and the like. The above material provides an advantage that a stretchable wiring achieving a good balance between electroconductive and stretchability can be obtained.

As a specific example of the electroconductive resin composition that can be used for the stretchable wiring that can be used in this embodiment, for example, an electroconductive resin composition including: (A) a resin having a molecule structure including at least one selected from (meta)acrylic acid esters, styrene and acrylonitrile as a constituent element, (B) a curing agent, and (C) an electroconductive filler having a flat shape and an aspect ratio of a thickness to an in-plane longitudinal direction of 10 or more (for example, the electroconductive resin compositions recited in JP 2018-35286 A and the like).

More specific examples of the above-mentioned electroconductive particles may include particles formed of silver, silver-coated copper (including a configuration in which a part of the surface of copper is coated with silver), copper, gold, carbon particles, carbon nanotubes, electroconductive polymers, tin, bismuth, indium and gallium, and alloys of these metals. Preferable examples include silver pastes, silver inks and the like including stretchable epoxy resins, acrylic resins, urethane resins, silicone resins, fluorine resins, styrene-butadiene copolymerized resins, in combination with silver powders, silver flakes and the like.

The method for forming the stretchable wiring of this embodiment is also not particularly limited, and the stretchable wiring can be formed by, for example, a printing process or the like. Specifically, a wiring having a desired pattern can be formed by applying an electroconductive paste or a liquid metal containing the binder resin and electroconductive particles as mentioned above onto the base material by printing by a printing method such as screen printing, inkjet printing, gravure printing or offset printing.

In the circuit board of this embodiment, the thicknesses of the respective layers of the land part, the stretchable base material and the stretchable wiring are not particularly limited. However, in order to retain the balance between the stretchability and the strength, for example, it is preferable that the land part has a thickness of 1 to 50 µm, the stretchable wiring has a thickness of 1 µm to 50 µm, and the stretchable base material has a thickness of about 10 µm to 500 µm.

Furthermore, the respective widths of the land part, the stretchable base material and the stretchable wiring are not particularly limited. However, in order to retain the balance between the stretchability and the strength, for example, it is preferable that the land part has a width of 10 to 1,000 µm, the stretchable wiring has a width of 20 to 2,000 µm, and the stretchable base has a width of about 0.5 to 2 cm.

Figure 2C:
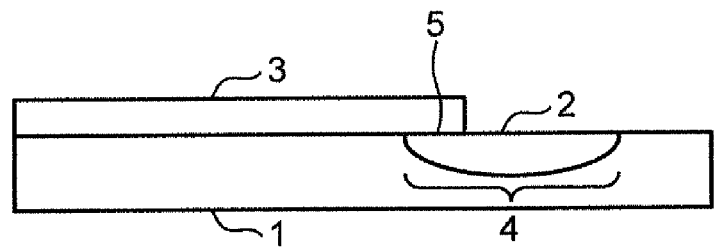

As shown in FIG. 1, the circuit board of this embodiment has a part 4 where a land part 2 is in contact with a stretchable base material 1, and the form of circuit board is not particularly limited as long as at least a part of the land part 2 is in contact with the stretchable base material 1. For example, as shown in FIG. 2(A), the whole rear surface of the land part 2 may be in contact with the surface of the stretchable base material 1. Alternatively, as shown in FIG. 2(C), the land part 2 may be embedded in the stretchable base material 1. By having the part 4 where the stretchable base material and the land part are in contact, even in a stretchable circuit board using a stretchable base material having the elongation rate, the stretchable base material and the land part show excellent adhesiveness, and it becomes possible that the circuit board of the electronic part or the like mounted on the stretchable base material shows high followability with respect to the elongation and restoration of the stretchable base material of this embodiment. In a plurality of land parts disposed on the circuit board of this embodiment, the stretchable circuit board may be a stretchable circuit board having land part(s) having a part 4 where the stretchable base material and the land part are in contact, and land part(s) without a part 4 in combination. The land part without a part 4 is, for example, a land part that is positioned on the stretchable wiring but is not in contact with the stretchable base material.

For example, as shown in FIG. 1, it is preferable that the land part 2 includes in its peripheral edge a connecting part 5 to which a stretchable wiring 3 is connected. It is considered that the stability of the land part on the stretchable base material is further improved by doing so. The connecting part as referred to in this embodiment is a part that electrically connects the land part 2 and the stretchable wiring 3, and can have various embodiments. Although the connecting part is referred to as "connecting part" in this specification for convenience, the connecting part may not necessarily be an independent constituent element, and may be a part of the land part 2 as mentioned above, or may be a part of the stretchable wiring 3. The form of the connecting part 5 is not particularly limited. As shown in FIG. 2(A), a side surface of the land part 2 may be in contact with a side surface of the stretchable wiring 3, or as shown in FIG. 2(B), the top surface of the land part 2 may be in contact with the bottom surface of the stretchable wiring 3, or as shown in FIG. 2(C), the connecting part 5 may be formed by disposing the stretchable wiring 3 on the land part 2.

Preferably, it is preferable that the top surface and/or the side surface of the land part 2 has/have the connecting part 5 with the stretchable wiring 3. It is considered that the stability of the land part 2 on the stretchable base material 1 is further improved by doing so.

Figure 5:
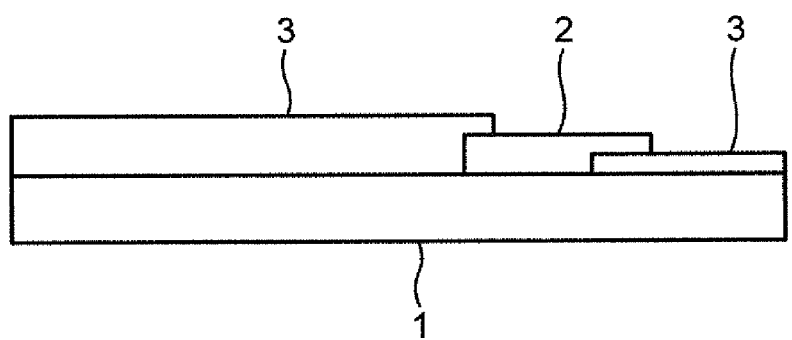
FIG. 5 is a schematic cross-sectional view illustrating a stretchable circuit board according to another embodiment of the present application.

Furthermore, as shown in FIG. 5, the land part 2 may have two or more connecting parts 5 with the stretchable wiring 3, and a part of the land part 2 may be connected onto the stretchable wiring 3.

The method for forming such connecting part 5 is not particularly limited, and for example, the connecting part 5 can be formed by forming a land and printing a stretchable wiring by a method such as lithography, dispenser printing, screen printing, inkjet printing, gravure printing or sintering.

Figure 4A:
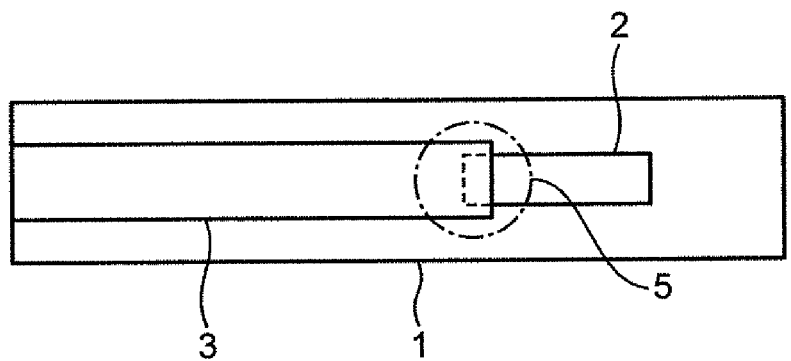
FIG. 4A and FIG. 4B show schematic top views illustrating some embodiments of the connecting part at the land part in the stretchable circuit board of the present application.

Furthermore, a connecting part 5 is described in detail with reference to FIG. 4(A). The connecting part 5 in this embodiment means the part where a land part 2 and the stretchable wiring 3 are overlapped. The presence of such connecting part 5 enables stable electrical connection during extension and contraction, or also during the deformation of the base material.

Figure 4B:
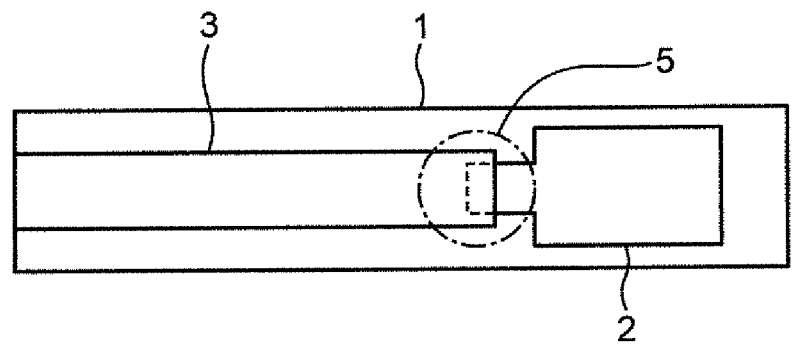

It is preferable that the end part (peripheral edge) of this land part is in contact with the stretchable wiring at a larger surface area. For example, it is preferable that the width of the land part at the connecting part is narrower than the width of the stretchable wiring 3. By doing so, there is an advantage that the contact surface area between the end part of the land part and the stretchable wiring at the connecting part can be increased, and thus the reliability of electrical connection can be improved. As shown in FIG. 4(B), if the width of the land part 2 at the connecting part 5 is narrower than the width of the wiring 3, it is possible to obtain the above-mentioned effect even if the width of the land part 2 is larger than the width of the wiring 3.

Furthermore, the circuit board of this embodiment may further have a second insulating layer, which is laminated on the stretchable base material. In the case where the stretchable base material is set as a first insulating layer, the second insulating layer may have the same configuration as that of the first insulating layer, or may have a different configuration. Furthermore, the circuit board of this embodiment may further have a second electroconductive layer on a layer position that is different from that of the stretchable wiring. In the case where the stretchable wiring is set as a first electroconductive layer, the second electroconductive layer may have the same configuration as that of the first electroconductive layer, or may have a different configuration. That is, the circuit board of this embodiment may have wirings on both the front and rear surfaces of the substrate, or the circuit board may be a circuit board on which circuits of a plurality of layers are laminated. Such circuit board has an advantage that the restriction conditions in the designing of a circuit can be significantly alleviated, and circuit components can be miniaturized. Furthermore, the second electroconductive layer may be connected by interlayer connection with the stretchable wiring. The means for connecting electroconductive interlayers (conduction means) is not particularly limited, and it is possible to connect by using known means such as plating, an electroconductive paste or the like.

Figure 3A:
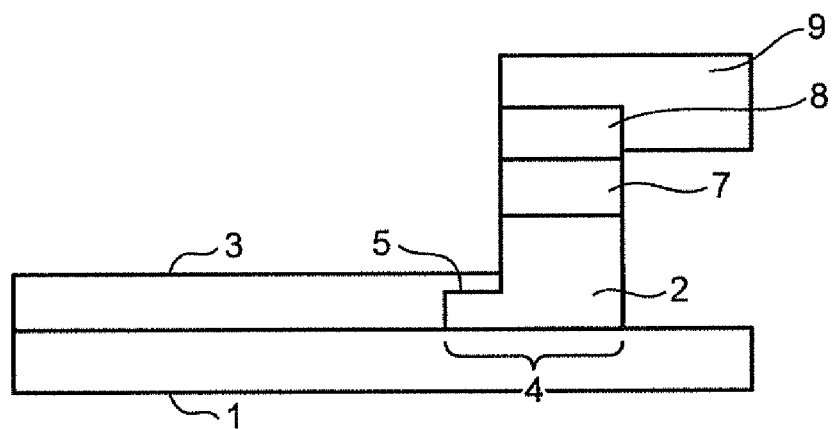
FIG. 3A and FIG. 3B show schematic cross-sectional views illustrating a stretchable circuit board including an electronic part mounted thereon according to an embodiment of the present application.

The circuit board on which an electronic part is mounted in this embodiment can be obtained by, for example, as shown in FIG. 3(A), mounting an electronic part 9 on which a pad part 8 is disposed on a soldering part 7 disposed, on a land part 2 connected to a stretchable wiring 3 disposed on a stretchable base material 1. Here, known means can be used as the method for mounting the soldering part, and for example, the soldering part can be formed by soldering printing by a metal mask or a flexo, heating by a reflow furnace or the like, or locally heating by a ultrasonic wave or the like.

Figure 3B:
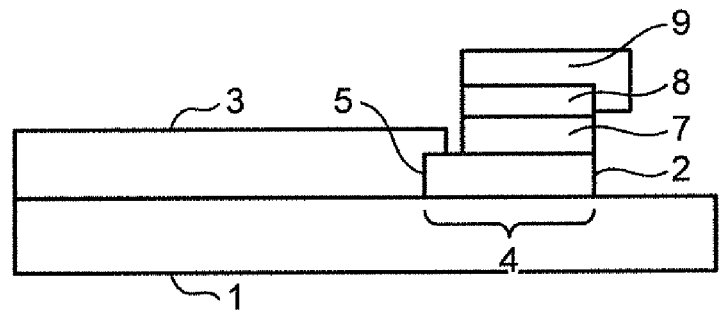

Alternatively, the form is not limited to the form of FIG. 3(A), and the land part 2, the soldering part 7 and the pad part 8 can be disposed, and the electronic part 9 can be mounted thereon in the form as shown in FIG. 3(B).

The electronic part that can be used in the present embodiment is not particularly limited, and examples may include wireless modules such as transistors, signal transmission elements, light emitting elements, solar power generation elements, diodes, switching elements, capacitors, coils, liquid crystals and Bluetooth (registered trademark), various sensors such as acceleration sensors, humidity sensors and temperature sensors, chip parts used for RFIDs and the like, and the like.

In the circuit board of this embodiment, it is preferable to protect a part or the entirety of the circuit by a coating of a resin or the like for the purpose of further protection from contacting and sliding from outside, insulation and water proofing, from the viewpoint of improvement of the reliability of the circuit board.

Figure 6:
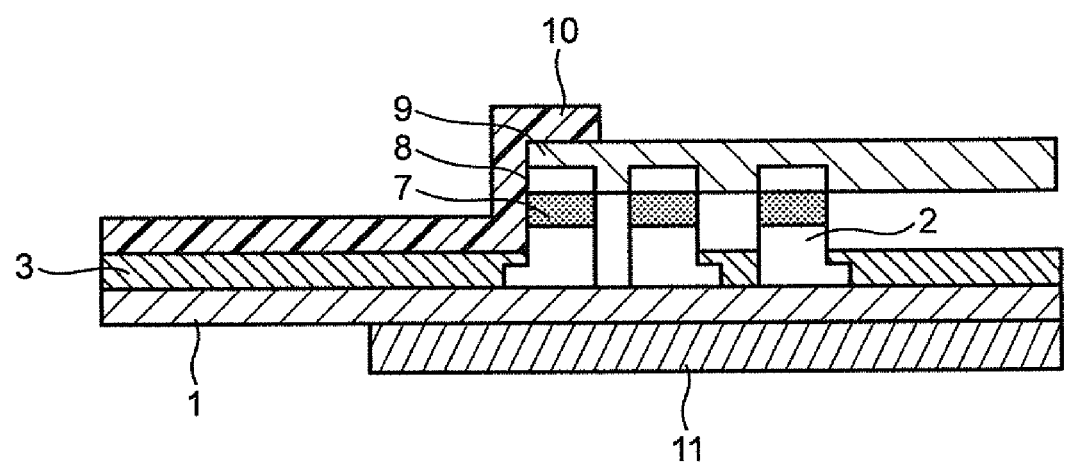
FIG. 6 is a schematic cross-sectional view illustrating a stretchable circuit board according to still another embodiment of the present application.

Specifically, the circuit board has a protective layer. The protective layer may be, for example, as shown in FIG. 6, a protective layer 10 including a resin composition for protecting the electronic part 9, the wiring 3 and the like on the outermost surface.

By having such protective layer, the circuit board has advantages that the circuit surface can be protected from moisture and friction, and that the circuit base material can be reinforced.

Figure 7:
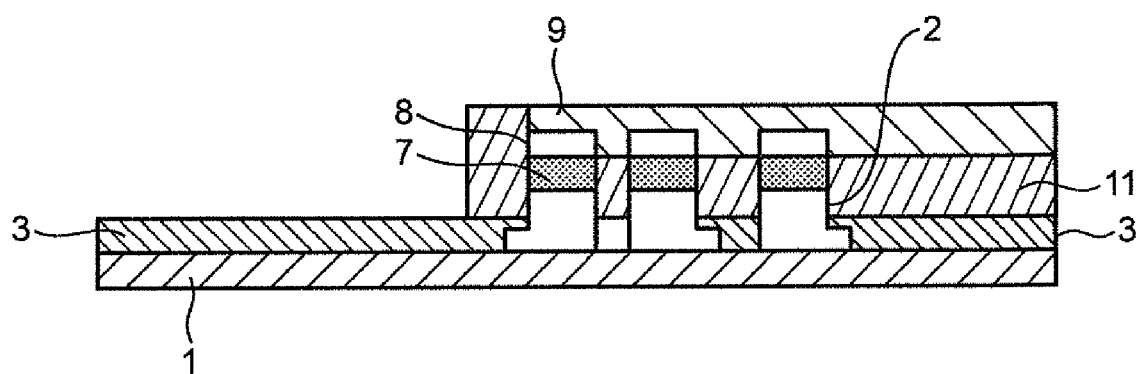
FIG. 7 is a schematic cross-sectional view illustrating a stretchable circuit board according to yet another embodiment of the present application.

Furthermore, the circuit board of this embodiment may have a reinforcing layer. Specifically, as shown in FIG. 6, a reinforcing layer 11 is disposed on the rear surface of the base material 1 by using a sheet-like resin. That is, the reinforcing layer 11 may be a resin sheet. Alternatively, as shown in FIG. 7, the joining part between the electronic part 9 and wiring 3 can be reinforced by disposing the reinforcing layer 11 by using a resin composition for use in potting, or the like. That is, the reinforcing layer 11 may be formed of a resin composition. By having such a reinforcing layer, the dropping off of parts and the like can be prevented more reliably.

The resin composition used in such a protective layer has a stretchability of 10% or more, preferably 25% or more, more preferably 50%, further preferably 100% or more, and has a tensile modulus at 25° C. room temperature of 0.5 MPa to 0.5 GPa, preferably 1 MPa to 300 MPa, more preferably 10 MPa to 100 MPa, further preferably 10 MPa to 50 MPa. As the resin composition that can be used in the protective layer in this embodiment, a curable resin composition, preferably a thermosetting resin composition or a thermoplastic resin can be used from the viewpoints of the purpose to protect the circuit surface from moisture and friction and to reinforce the circuit substrate, and examples include silicone resins, urethane resins, epoxy resins, acrylic resins and fluorine rubbers, and examples of the thermoplastic resin include urethane resins, various rubbers, acrylic resins, olefin-based resins, ethylene-propylene-diene rubbers, isoprene rubbers, butadiene rubbers and chloroprene rubbers. In the case of use in the protective layer that can be used in this embodiment, it is particularly preferable to use an olefin resin, an acrylic resin or an epoxy resin.

The resin composition used in such a reinforcing layer has a stretchability of 10% or more, preferably 25% or more, more preferably 50%, further preferably 100% or more, and has a tensile modulus at 25° C. room temperature of 10 MPa to 8 GPa, preferably 100 MPa to 6 GPa, more preferably 500 MPa to 6 GPa, further preferably 500 MPa to 2 GPa. As the resin composition that can be used in the reinforcing layer in this embodiment, a curable resin composition, preferably a thermosetting resin composition or a thermoplastic resin can be used from the viewpoints of the purpose to reinforce the joining part between the electronic part 9 and the wiring 3, and to prevent dropping off of parts more reliably, and examples of the thermosetting resin composition include silicone resins, urethane resins, epoxy resins, acrylic resins and fluorine rubbers, and examples of the thermoplastic resin include urethane resins, various rubbers, acrylic resins, olefin-based resins, ethylene-propylene-diene rubbers, isoprene rubbers, butadiene rubbers, chloroprene rubbers, polyethylene terephthalate, polyimides, polyphenylene sulfide resins, polyamide resins and polystyrene resins. In the case of use in the reinforcing layer that can be used in this embodiment, it is particularly preferable to use a polyethylene terephthalate, a polyimide, a polyphenylenesulfide resin, a polyamide resin, a polystyrene resin or an epoxy resin.

Examples of the means for forming the protective layer and the reinforcing layer include a method by spray application, a method for attaching a protective layer or reinforcing layer processed into a sheet shape by a laminator, and means for applying a liquid resin by die coat, inkjet, dispenser, electrostatic spraying, deposition or the like. These techniques may be conventional techniques, or improved techniques may also be used.

The protective layer 10, the reinforcing layer 11 and the like can protect or reinforce the joining part of the part or the circuit itself, by being disposed on the mounted electronic part or the periphery thereof, or the entirety of the circuit. Furthermore, by covering the surface layer of a circuit by a protective layer 10 as shown in FIG. 6, the resistance against wearing from the outside, water proofing property and the like are improved, and the dropping off of the part, and the like can also be prevented. That is, in the stretchable circuit board of the present invention, it is preferable that at least one of the insulating layers is the protective layer on the outermost layer.

(Production Method)

The method for producing the stretchable circuit board of this embodiment is not particularly limited, and for example, the stretchable circuit board can be produced by the following method.

First, a stretchable resin-attached copper foil is patterned by lithography to form a land of a copper foil on a stretchable base material. Furthermore, by forming a stretchable silver wiring on the patterned land-attached stretchable base material by screen printing, a land part and a stretchable wiring can be formed on the stretchable base material.

More specifically, the stretchable circuit board can be produced by, for example, the following production method.

Production Example 1

<Formation of Stretchable Wiring and Land>

A silver paste (PE803, manufactured by Du Pont) was printed by a screen on the matte surface of a copper foil (JTC-LP 18 µm, manufactured by Mitsui Mining & Smelting Co., Ltd.) and dried at 100° C. for 30 minutes to form a circuit on a copper foil. Furthermore, a resin (SILPOT184, manufactured by Dow Corning Toray Co., Ltd.) was applied by a bar coater onto the print surface of the silver paste, and subjected to intermediate curing at 100° C. for 30 minutes to obtain a film including a wiring and a stretchable base material formed on the copper foil.

Thereafter, a dry film resist was laminated on the surface opposite to the surface on which the resin has been applied and developed by photolithography, and the copper foil was subjected to etching to obtain a circuit board on which a copper foil land had been formed.

<Mounting of Part>

A cream solder was printed with a metal mask on the copper foil land part of the obtained circuit board, whereby an electronic part (chip resistance: 1608, 5025 size) was mounted. The electronic part was mounted on a hot plate set at 180° C.

Production Example 2

<Formation of Land on Stretchable Base Material>

Firstly, a resin for a stretchable base material was prepared as follows. 100 parts by mass of polyrotaxane: (manufactured by Advanced Softmaterials Inc., "A1000"), 75 parts by mass of an epoxy resin (manufactured by Mitsubishi Chemical Corporation, "JER1003"), 1.1 parts by mass of an imidazole-based curing accelerator (manufactured by Shikoku Chemicals Corporation "2E4MZ", 2-ethyl-4-methylimidazole), and 45 parts by mass of a crosslinking agent: (isocyanate, manufactured by DIC, "DN950") were added to a solvent (methyl ethyl ketone) so that the concentration of the solid content became 40 mass %, and the respective components were homogeneously mixed (300 rpm, 30 minutes) to prepare a resin composition.

Secondly, the resin composition was applied onto the matte surface of a copper foil (3ECVLP 18 µm, manufactured by Mitsui Mining & Smelting Co., Ltd.) by a bar coater. The solvent was dried at 100° C. for 10 minutes, and thereafter the resin was cured at 170° C. for 1 hour to obtain a resin-attached copper foil. The resin layer had a thickness of 50 µm. A dry film resist was laminated on the copper foil surface by photolithography to obtain a resin film on which a copper foil land is formed.

<Formation of Circuit>

A stretchable wiring (silver paste) was prepared as follows. As a resin, 10.0 parts by mass of an epoxy-modified acrylic acid ester resin "PMS-14-2" (manufactured by Nagase ChemteX Corporation, epoxy equivalent amount: 1,852 g/eq, molecular weight: 1,000,000, Tg: −35° C.), 2.7 parts by mass of an amine-based compound: bifunctional polyetheramine "D2000" (manufactured by Mitsubishi Chemical Fine Corporation) as a curing agent, 0.1 parts by mass of an imidazole-based curing accelerator: 2-ethyl-4-methylimidazole "2E4MZ" (manufactured by Shikoku Chemicals Corporation), 50.0 parts by mass of a silver powder"Ag-XF-301" (specific surface area: 2.0 m2/g, tap density: 0.56 g/cm3, manufactured by Fukuda Metal Foil & Powder Co., Ltd.) as an electroconductive filler, 0.5 parts by mass of a polyester-modified silicon-based surface-adjusting agent: "BYK-370" (manufactured by BYK-Chemie Japan) as a surfactant, 0.2 parts by mass of a block copolymer type wet dispersant "DISPERBYK-2155" (manufactured by BYK-Chemie Japan) as a dispersant, and 0.2 parts by mass of glycidoxypropyltrimethoxysilane "KBM-403" (manufactured by Shin-Etsu Silicone) were added to a solvent (cyclohexanone, 2.0 parts by mass), and stirred by a planetary centrifugal mixer ("ARV-310" by THINKY, 2,000 rpm-3 min) to homogeneously mix the respective components, whereby an electroconductive resin composition was prepared.

Furthermore, the silver paste was printed with a screen so that the silver paste partially overlaps with the land part, dried in an oven at 100° C. for 10 minutes, and then cured in an oven at 150° C. for 1 hour to obtain a stretchable circuit board.

<Mounting of Part>

A part was mounted in a manner similar to that in Production Example 1.

Production Example 3

<Formation of Land on Stretchable Base Material>

A resin film (#3412, manufactured by BEMIS) was laminated on the matte surface of a copper foil (3ECVLP 18 µm, manufactured by Mitsui Mining & Smelting Co., Ltd.) by using a vacuum laminator (achieved vacuum degree: 0.1 hPa, set temperature: 120° C., pressurizing force: 0.2 Mpa, pressurization time: 30 minutes) to obtain a resin-attached copper foil.

A dry film resist was laminated on the copper foil surface to obtain a resin film on which a photolithography copper foil land is formed.

<Formation of Circuit>

A silver paste (SSP1409, manufactured by Toyobo Co., Ltd.) was printed with a screen so that the silver paste partially overlaps with the land part, dried in an oven at 100° C. for 10 minutes, and then cured in an oven at 150° C. for 1 hour to obtain a stretchable circuit board.

<Mounting of Part>

A part was mounted in a manner similar to that in Production Example 1.

Production Example 4

<Formation of Land on Stretchable Base Material>

A resin (similar to that used in Preparation Example 2) was applied on the mold release surface of a PET film in which one surface had been mold-release treated by a bar coater, the solvent was dried at 100° C. for 10 minutes, and thereafter the resin was cured at 170° C. for 1 hour to obtain a resin-attached PET film. Thereafter, a silver paste (CA-8590B, manufactured by Daiken Chemical Co., Ltd.) was printed with a screen printing plate having a land shape, and dried at 100° C. for 10 minutes and then cured at 150° C. for 1 hour to form a land.

<Formation of Circuit>

A silver paste (similar to that used in Production Example 2) was printed with a screen so that the silver paste partially overlaps with the land part, dried in an oven at 100° C. for 10 minutes, and then cured in an oven at 150° C. for 1 hour to obtain a stretchable circuit board.

<Mounting of Part>

A part was mounted in a manner similar to that in Production Example 1.

Production Example 5

A mounted stretchable circuit board was obtained in a similar manner to that of Production Example 1. Thereafter, the surface was coated with a liquid resin (1B51NSLU, manufactured by CHASE Corp) by spraying to form a coating. Furthermore, a fabric of a polyester material was laminated onto the rear surface of the substrate via a film (SHM107, manufactured by Sheedom Co., Ltd.) with an iron set to about 170° C.

(Applications)

Since the stretchable circuit board of the present embodiment has a feature that it achieves a balance between high stretchability and mountability or adhesiveness, existing facilities can be applied to various technical fields such as fields of optics, electronics, adhesives and medicine. Therefore, the circuit board is very advantageous in industrial utilization.

Particularly, since it is a circuit board that allows mounting by soldering while maintaining sufficient stretchability, it is very preferable as a circuit board for use in, for example, patch devices, foldable electronic paper, organic EL displays, wearable devices and the like.

Particularly, the circuit board is useful as a patch device to be attached to cloths and the like for use in applications such as vital sensing in medicine, sports and the like.

In these cases, it is preferable that the electronic part in the circuit board of this embodiment has at least a function to communicate with an outer system and a sensor function. By doing so, there is an advantage that the operational status of a device can be confirmed by the outer system without being aware of the main body of the device. Alternatively, it is also preferable that the electronic part has a system that is driven by a command from the outer system. By doing so, there is an advantage that the operations of the device can be instructed and driven by remote control from the outer system. Furthermore, the device may be a device having an electronic part having all of the above-mentioned functions.

The present application is based on U.S. provisional application No. 62/553,967 filed on Sep. 4, 2017, and the contents therein are incorporated herein.

While the present invention has been described appropriately and sufficiently through the embodiments for expressing the present invention with reference to the drawings, specific examples and the like as mentioned above, it should be recognized that any person skilled in the art can easily modify and/or improve the above-mentioned embodiments. Therefore, as long as the modified embodiments or improved embodiments carried out by a person skilled in the art are not at such a level that the embodiments deviate from the scope of claims recited in the claims, it is interpreted that the modified embodiments or improved embodiments are encompassed in the scope of claims.

INDUSTRIAL APPLICABILITY

The present invention has broad industrial applicability in the technical fields of electronic materials and various devices using the electronic materials.

The invention claimed is:

1. A stretchable circuit board comprising a stretchable base material, a stretchable wiring, and a land part that is in contact with the stretchable base material, wherein
   the land part is formed of a patterned metal foil, or a printed product of an electroconductive ink containing metal particles,
   the stretchable base material has a tensile modulus at 25° C. room temperature of 0.5 MPa to 0.5 GPa, and
   the stretchable wiring has a tensile modulus at 25° C. room temperature of 0.5 MPa to 0.5 GPa.

2. The stretchable circuit board according to claim 1, wherein the stretchable base material is formed of a thermosetting resin composition.

3. The stretchable circuit board according to claim 1, wherein the stretchable base material is formed of a thermoplastic resin composition having a softening point or a melting point of 140° C. or more.

4. The stretchable circuit board according to claim 1, wherein the stretchable wiring has a binder resin and electroconductive particles.

5. The stretchable circuit board according to claim 1, further comprising a second insulating layer laminated on the stretchable base material.

6. The stretchable circuit board according to claim 1, further comprising a second electroconductive layer on a layer position different from a position of the stretchable wiring.

7. The stretchable circuit board according to claim 6, wherein the second electroconductive layer is connected by interlayer connection with the stretchable wiring.

8. The stretchable circuit board according to claim 1, on which an electronic part is mounted.

9. The stretchable circuit board according to claim 5, comprising a protective layer.

10. The stretchable circuit board according to claim 8, comprising a reinforcing layer.

11. The stretchable circuit board according to claim 10, wherein the reinforcing layer is a resin composition.

12. The stretchable circuit board according to claim 10, wherein the reinforcing layer is a resin sheet.

13. A patch device using the stretchable circuit board according to claim 8, wherein the electronic part has at least a function to communicate with an outer system, and a sensor function.

14. The patch device according to claim 13, comprising a system that is driven by a command from the outer system.

* * * * *